US006172351B1

(12) United States Patent
Kimura (10) Patent No.: US 6,172,351 B1
(45) Date of Patent: Jan. 9, 2001

(54) PHOTOELECTRIC INTEGRATED CIRCUIT DEVICE

(75) Inventor: Masanobu Kimura, Kamakura (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/135,552

(22) Filed: Aug. 18, 1998

(30) Foreign Application Priority Data

Aug. 28, 1997 (JP) .................................................. 9-232947

(51) Int. Cl.[7] .................................................. H01L 27/00
(52) U.S. Cl. ...................................... 250/208.1; 250/216
(58) Field of Search .............................. 250/208.1, 216, 250/214.1, 214 R; 257/291, 292, 293, 233, 446

(56) References Cited

U.S. PATENT DOCUMENTS 4,447,720 * 5/1984 Ogawa et al. ..................... 250/208.1
4,841,348 * 6/1989 Shizukuishi et al. ................ 257/291

FOREIGN PATENT DOCUMENTS 1-173752   7/1989 (JP) .
7-99214    4/1995 (JP) .

* cited by examiner

Primary Examiner—Que T. Le
(74) Attorney, Agent, or Firm—Pillsbury Madison & Sutro LLP (57) ABSTRACT

Power supplies, a ground, and so forth of an analog portion including an image pickup portion 12 are connected to electrode pads 14. Power supplies, a ground, and so forth of a digital portion are connected to electrode pads 15. Thus, various problems such as an increase of impedance of power supplies and a ground, signal crosstalk between each circuit, and noise due to internal line connections between the image pickup portion 12 and a peripheral portion 13 can be prevented.

6 Claims, 8 Drawing Sheets

PHOTOELECTRIC INTEGRATED CIRCUIT DEVICE

BACKGROUND OF THE INVENTION

1. Field of the Invention

The present invention relates to an optical integrated circuit that integrates an image pickup device (for use with a video camera or an electronic camera) and a peripheral circuit.

2. Description of the Related Art

Figure 7A:
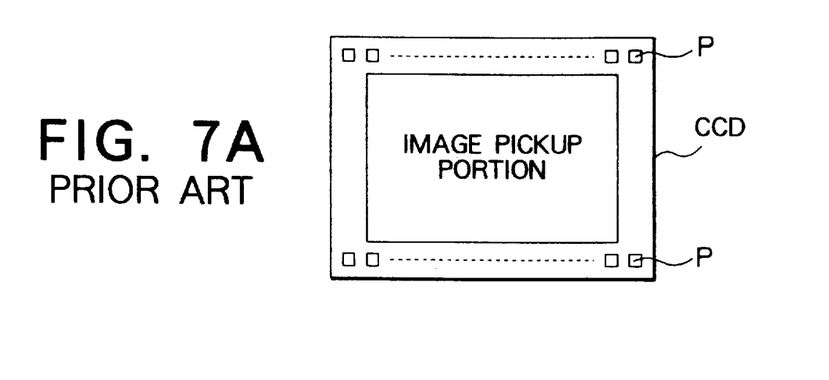
FIGS. 7A and 7B are schematic diagrams for explaining an IC chip for a CCD.
Figure 7B:
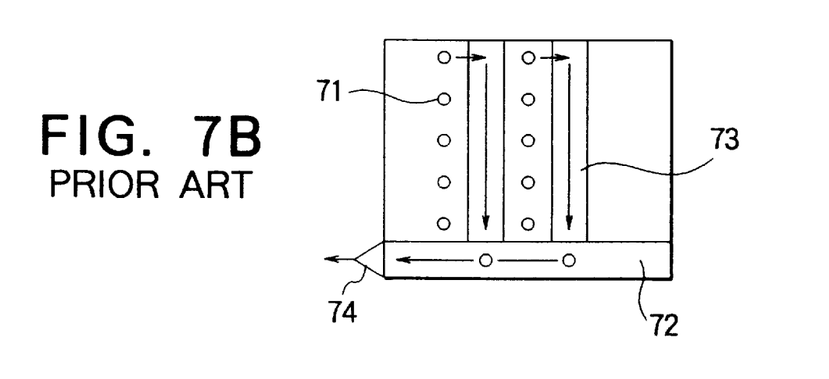
Figure 8:
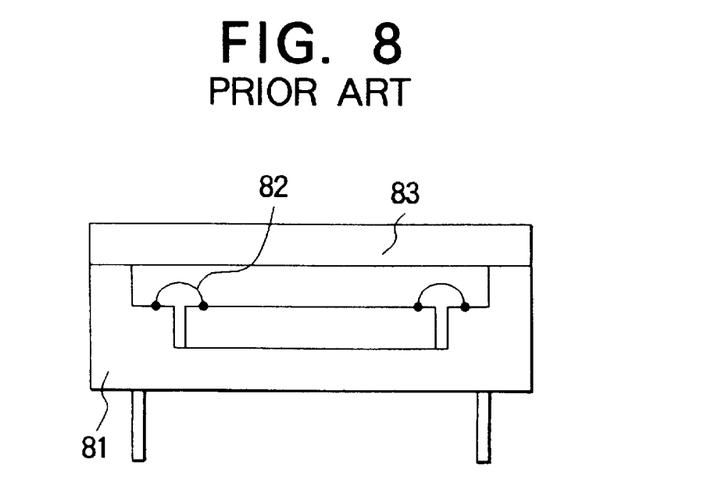
FIG. 8 is a sectional view for explaining the structure of the CCD.
Figure 9:
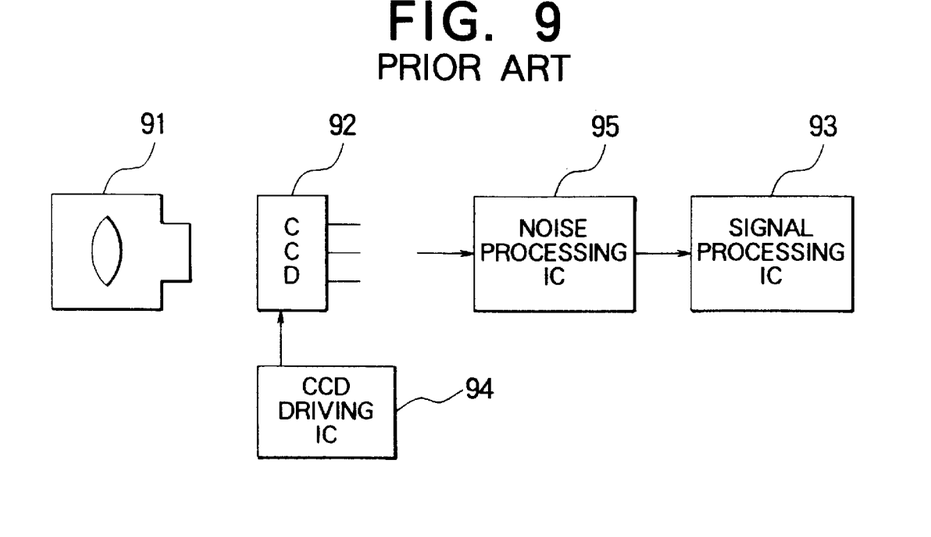
FIG. 9 is a schematic diagram for explaining an example of the structure of a CCD video camera.

FIGS. 7A and 7B show an IC chip for a conventional charge coupled device (CCD) as an image pickup device. The CCD comprises photo diodes 71, a horizontal CCD transferring portion 72, a vertical CCD transferring portion 73, and a signal outputting portion 74. As shown in FIG. 8, the CCD is housed in a ceramics package 81. Electrode pads of the CCD are connected with wire bonds 82. The resultant structure is packaged with a cover glass 83. As shown in FIG. 9, a CCD camera comprises a light receiving portion 91, a CCD 92, a signal processing IC 93, a CCD driving IC 94, and a noise processing IC 95.

Figure 10:
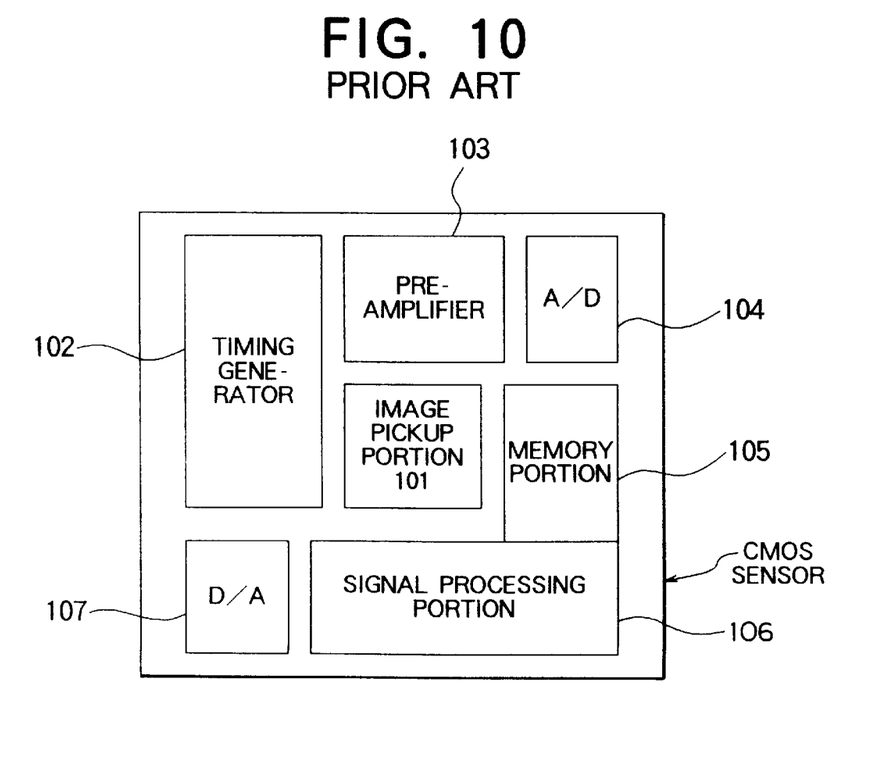
FIG. 10 is a schematic diagram for explaining an example of the internal structure of a conventional CMOS type image pickup device.

An MOS type sensor that had been used for an image pickup device as with a conventional CCD has been attractive because of improvements in sensitivity, S/N ratio, and so forth. Unlike with the conventional CCD, since the CMOS sensor can be fabricated in a conventional IC fabricating process, as shown in FIG. 10, an image pickup device 101 and peripheral circuits 102 to 107 are integrated as a one chip IC. Thus, when this IC is used for a video camera, the size thereof can be decreased.

When electrode pads P are disposed to the IC that integrates the image pickup portion 101 and the peripheral circuits 102 to 107 by the wire bond method as shown in FIG. 7, impedance of each of power supply and ground of the internal circuits rises due to the influence of internal line connections. Thus, various problems such as noise and signal crosstalk take place.

Figure 11:
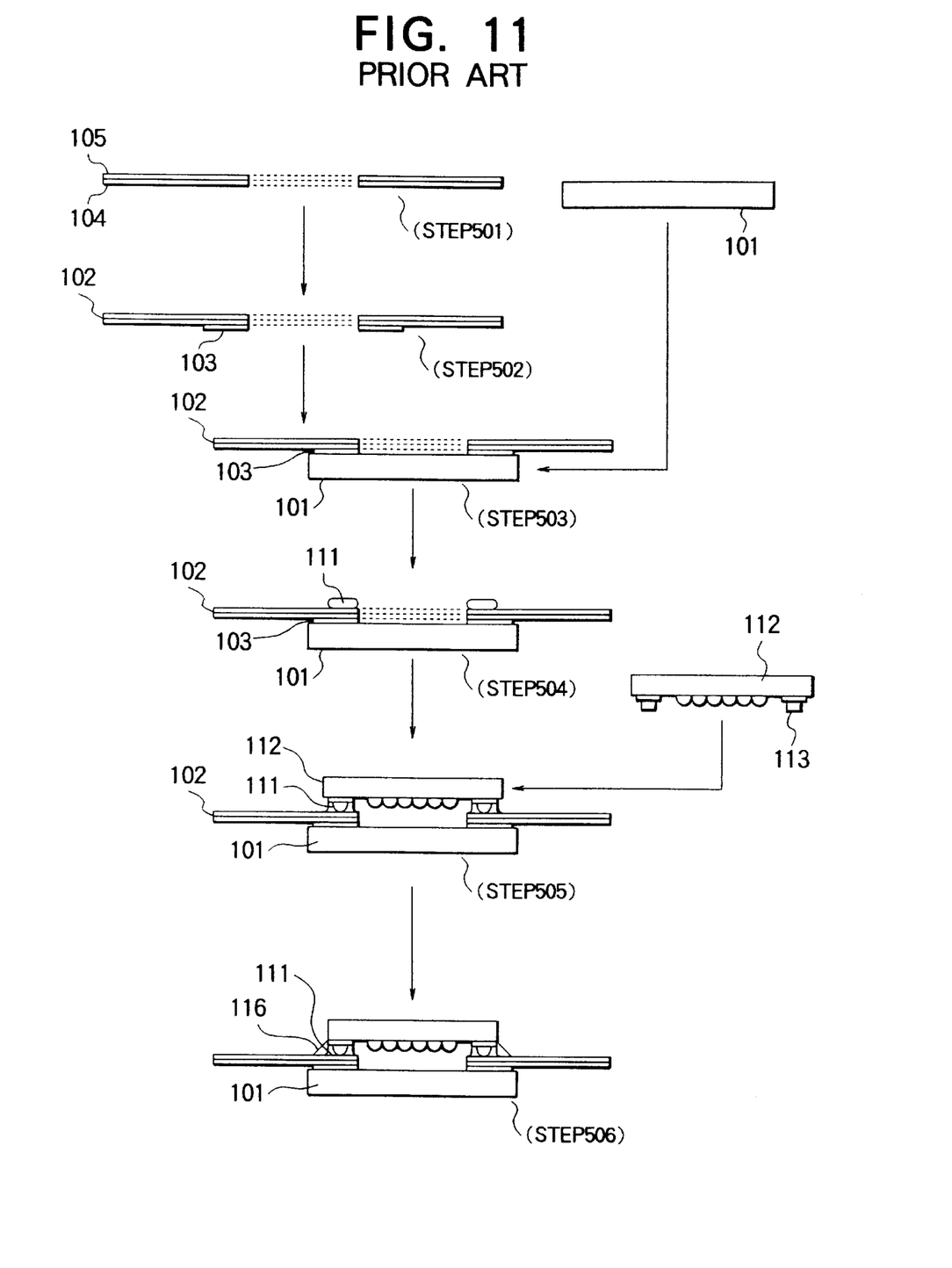
FIG. 11 is a schematic diagram for explaining mounting steps of bare chips for a conventional image pickup device.
Figure 12:
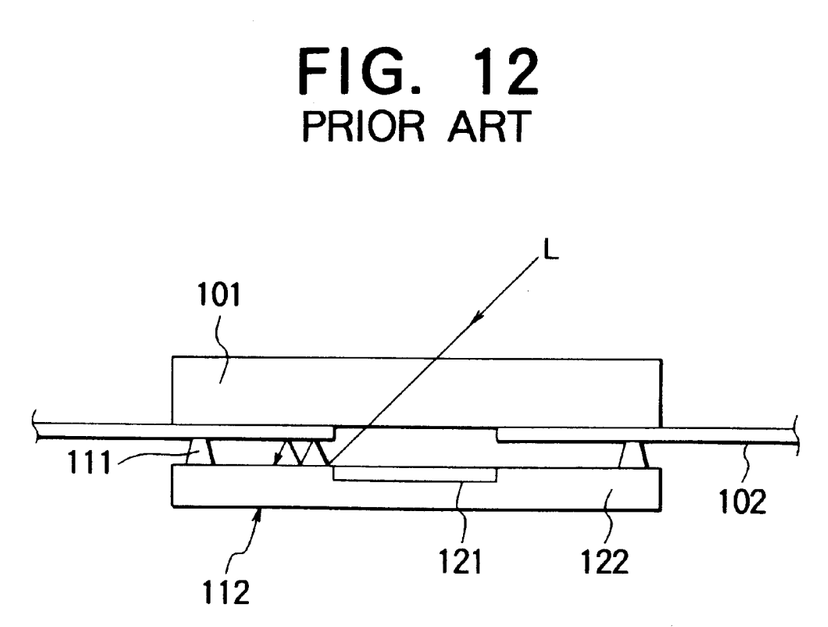
FIG. 12 is a sectional view for explaining a problem in the structure shown in FIG. 11.

In addition, when bare chips as shown in FIG. 11 are mounted in the state that the electrode pads are disposed on the periphery of ICs (as in Japanese Patent Laid-Open Application No. 7-99214), the size of a cover glass 101 becomes large. Thus, the cost rises and optical accuracy deteriorates. In addition, as shown in FIG. 12, light L that enters through the cover glass 101 internally reflects on a peripheral portion 122 of an image pickup portion 121 of a CCD 112. Thus, a ghost may take place in the resultant picture contains a ghost.

As described above, in the conventional optical integrated circuit apparatus, impedance of each of power supplies and ground of internal circuits rises due to the influence of internal line connections thereof. Thus, various problems such as noise and signal crosstalk take place. In addition, the size of the cover glass becomes large and the cost rises. Moreover, the optical accuracy deteriorates.

SUMMARY OF THE INVENTION

An object of the present invention is to provide an optical integrated circuit apparatus that suppresses the influence of internal line connections thereof and that allows the size of a cover glass to decrease.

To accomplish the above-described object, an optical integrated circuit apparatus according to the present invention is an optical integrated circuit having at least one optical functional portion for converting incident light into an electric signal and a peripheral circuit portion for processing the electric signal received from the optical functional portion, comprising signal electrode pads disposed on the periphery of the optical integrated circuit and on the periphery of the optical functional portion.

Thus, since internal line connections can be routed on the periphery of an analog portion and a digital portion, the optical accuracy can be improved and the impedance of an output signal can be decreased.

These and other objects, features and advantages of the present invention will become more apparent in light of the following detailed description of a best mode embodiment thereof, as illustrated in the accompanying drawings.

DESCRIPTION OF PREFERRED EMBODIMENTS

Figure 1A:
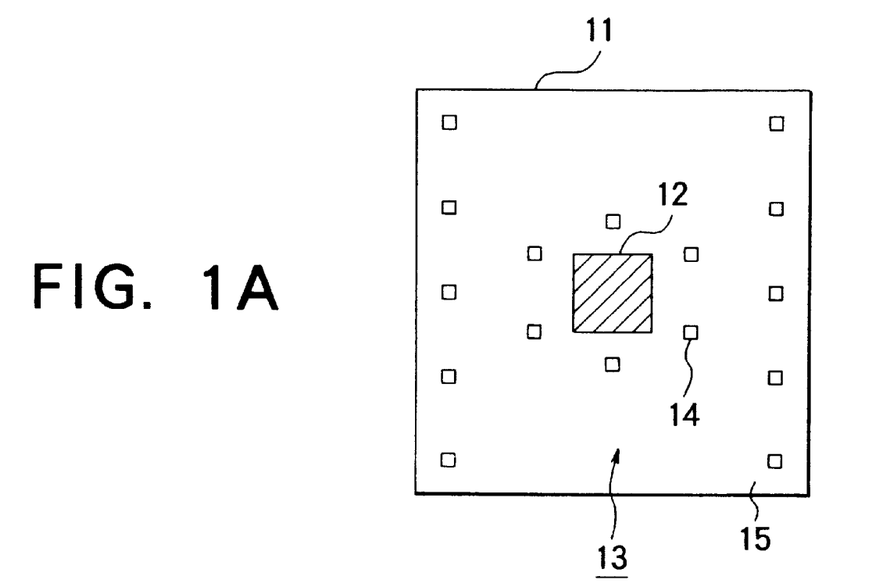
FIG. 1A is a plan view for explaining a first embodiment of the present invention.
Figure 1B:
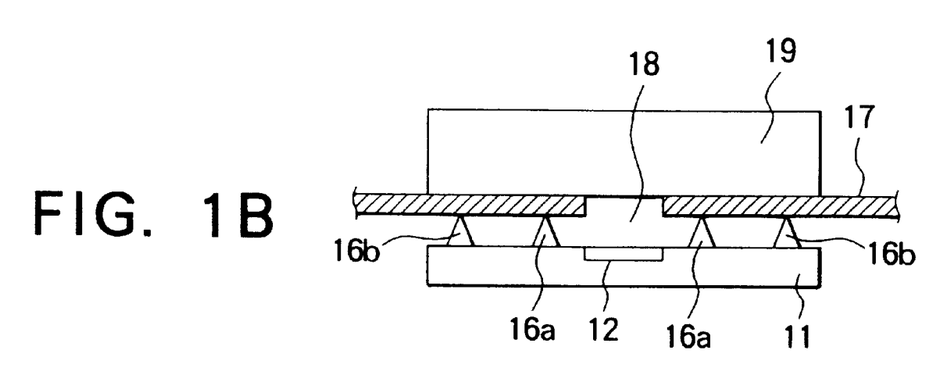
FIG. 1B is a sectional view of FIG. 1A.
Figure 2:
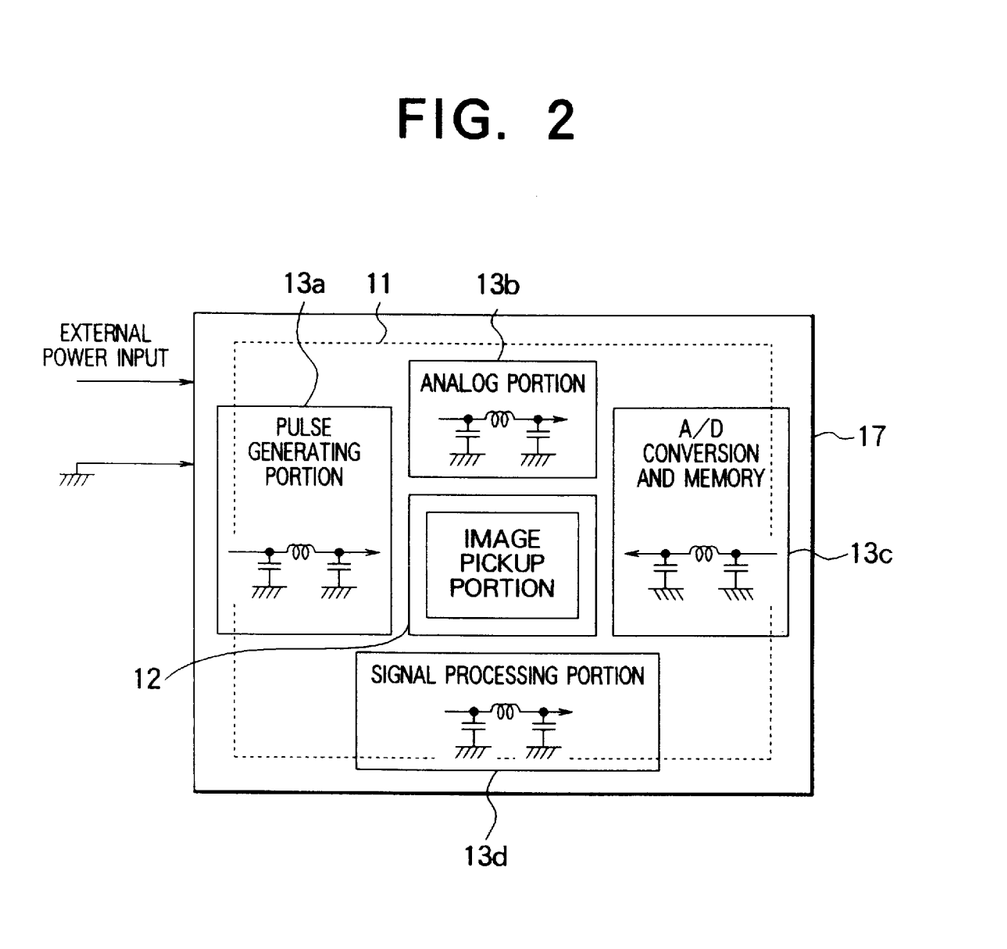
FIG. 2 is a schematic diagram for explaining an example of the structure of an IC that integrates an image pickup portion shown in FIGS. 1A and 1B and a peripheral circuit portion.

Next, with reference to the accompanying drawings, embodiments of the present invention will be described. FIGS. 1A, 1B, and 2 are schematic diagrams for explaining a first embodiment of the present invention. In FIG. 1A, reference numeral 11 represents an IC apparatus according to the first embodiment of the present invention. The IC apparatus 11 is a one-chip IC of which an image pickup portion 12 and a peripheral circuit portion 13 thereof are structured with one chip. The peripheral circuit portion 13 comprises a pulse generating portion 13a, an analog portion 13b, an A/D conversion and memory portion 13c, and a signal processing portion 13d. Thus, the image pickup portion 12 and the peripheral circuit portion 13 are composed of the transistors that can be structured as one chip, for example MOS type transistors. Electrode pads 14 are disposed on the front surface and on the periphery of the image pickup portion 12 so that the electrode pads 14 are electrically connected to the image pickup portion 12. In addition, electrode pads 15 are disposed on the front surface and on the periphery of the IC 11 so that the electrode pads 15 are connected to the peripheral circuit portion 13.

The image pickup portion 12 outputs an analog signal. The electrode pads 14 connected to the image pickup portion 12 are connected to power supplies and a ground. The electrode pads 15 electrically connected to the peripheral circuit portion 13 are connected to output signals thereof, power supplies, and a ground, with converting output from the image pickup portion 12 into a digital signal.

As shown in FIG. 1B, gold bumps 16a and 16b as the electrode pads 14 and 15 are electrically connected to a wiring pattern in the state that an opening portion 18 of a TAB tape 17 is opposite to the image pickup portion 12. A cover glass 19 is secured to the rear surface (non-component surface) of the TAB tape 17 in such a manner that the cover glass 19 closes the opening portion 18.

Since the power supplies and the ground of the analog portion are connected to the electrode pads 14 and the power supplies and the ground of the digital portion are connected to the electrode pads 15, various problems such as an increase of the impedance of power supplies and a ground, signal crosstalk between each circuit, and noise due to internal line connections can be prevented. In addition, since the image pickup portion 12 is disposed at the center of the IC 11, the optical axis of the optical lens disposed in front of the image pickup portion 12 can be easily aligned and thereby the structure of the apparatus can be simplified.

Figure 3A:
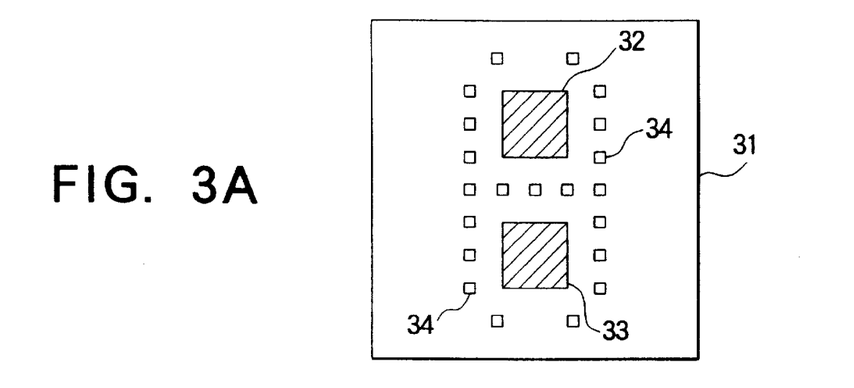
FIG. 3A is a plan view for explaining a second embodiment of the present invention.
Figure 3B:
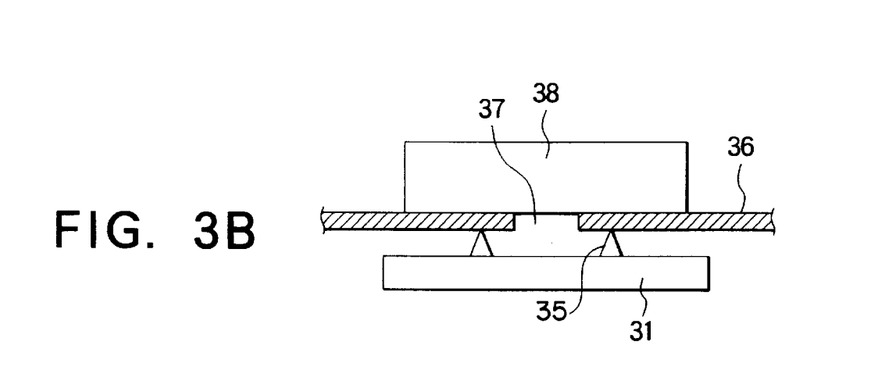
FIG. 3B is a sectional view of FIG. 3A.

FIGS. 3A and 3B are schematic diagrams for explaining a second embodiment of the present invention. In the second embodiment, as shown in FIG. 3A, image pickup portions 32 and 33 are disposed at center portions of an IC 31. Electrode pads 34 are disposed on the periphery of the image pickup portions 32 and 33.

In this case, as shown in FIG. 3B, gold bumps 35 as the electrode pads 34 are electrically connected to a wiring pattern in the state that an opening portion 37 of a TAB tape 36 is opposite to the image pickup portions 32 and 33. A cover glass 38 is secured to the rear surface (non-component surface) of the TAB tape 36 so that the cover glass 38 closes the opening portion 37.

In this embodiment, since the image pickup portions 32 and 33 are electrically connected to the electrode pads 34 at adjacent positions, an increase of the impedance of the power supplies and ground due to internal line connections can be prevented.

Figure 4:
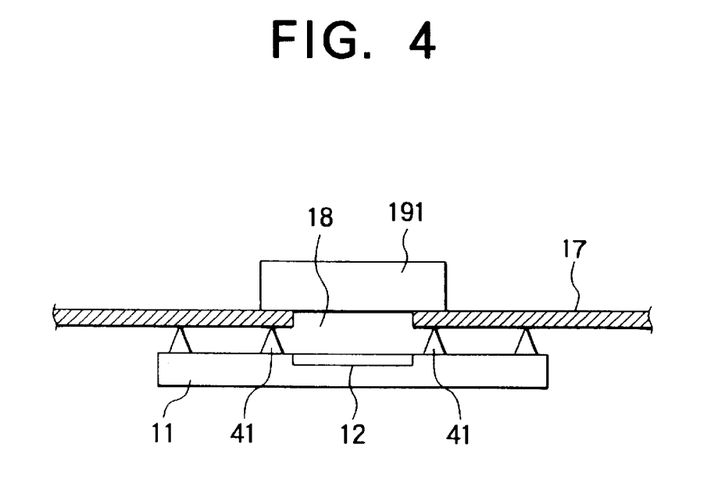
FIG. 4 is a sectional view for explaining a third embodiment of the present invention.

FIG. 4 is a sectional view for explaining a third embodiment of the present invention. For simplicity, in FIG. 4, similar portions to those in FIG. 1 are denoted by similar reference numerals. In the third embodiment, when the electrode pads 14 shown in FIG. 1A and a connection pattern of the TAB tape 17 are electrically connected, for example a black anisotropic conductive film 41 with a low reflectance is disposed around the image pickup surface of the image pickup portion 12. The black anisotropic conductive film 41 disposed on the periphery of the image pickup portion 12 suppresses light that enters through a cover glass 191 and an opening portion 18 from reflecting on the internal surfaces of, for example the TAB tape 17 and the IC 11.

In addition, the size of the cover glass 191 is slightly larger than the size of the opening portion 18 in the condition that the cover glass 191 is opposite to the electrode pads 14 through the TAB tape 17. Although the cover glass 191 is small, since the anisotropic conductive film 41 is disposed below the cover glass 191 through the TAB table 17, the TAB table 17 does not bend.

In this embodiment, the anisotropic conductive film 41 disposed on the periphery of the image pickup portion 12 can prevent a ghost due to light reflected on the internal surfaces of the IC chip from taking place. In addition, the size of the cover glass 191 can be decreased. Thus, the cost of the apparatus can be reduced.

In the first embodiment shown in FIGS. 1A and 1B, the size of the cover glass may be slightly larger than the size of the opening portion 18 in the condition that the cover glass is opposite to the electrode pads 14 through the TAB tape. Likewise, in the second embodiment shown in FIGS. 3A and 3B, the size of the cover glass may be slightly larger than the size of the opening portion 37 in the condition that the cover glass is opposite to the electrode pads 34 through the TAB tape. In these cases, as with the third embodiment, since a small cover glass can be used, the cost of the apparatus be reduced.

Figure 5:
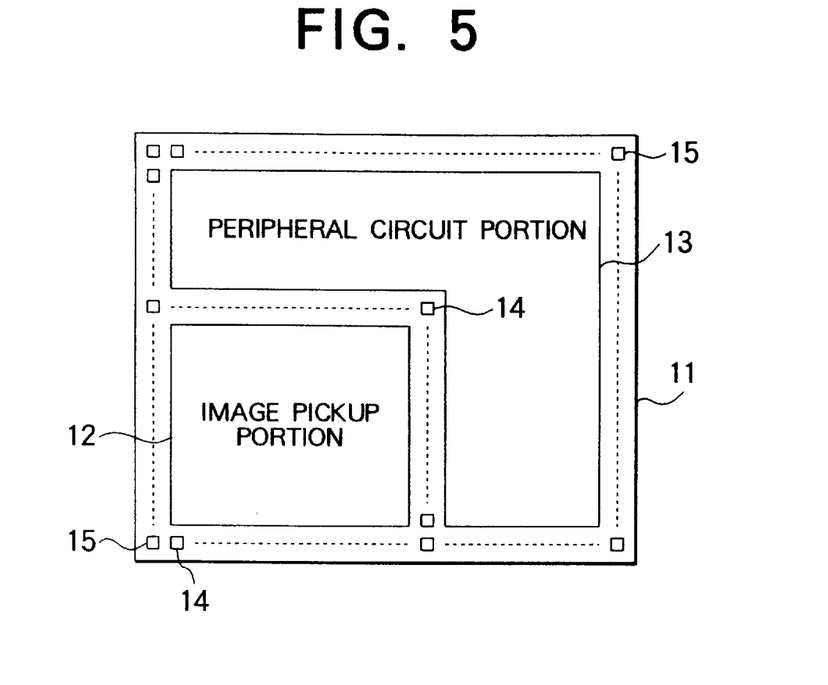
FIG. 5 is a schematic diagram for explaining a modification of the present invention.
Figure 6:
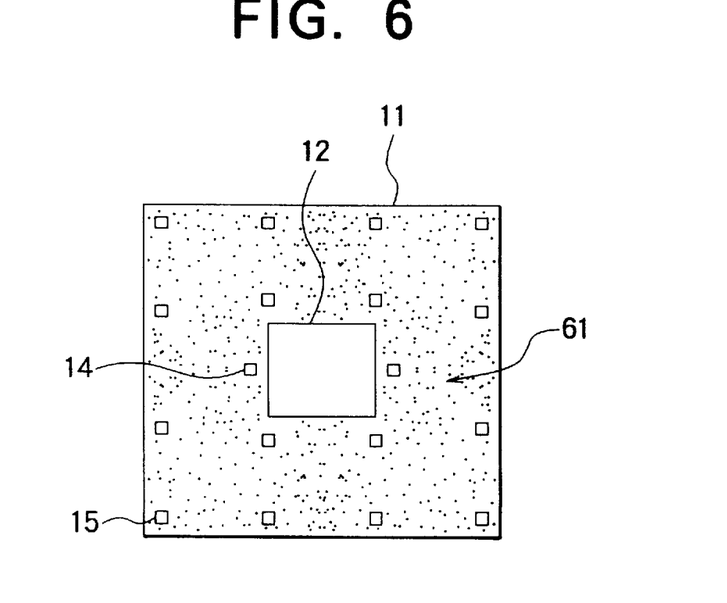
FIG. 6 is a schematic diagram for explaining another modification of the present invention.

It should be noted that the present invention is not limited to the above-described embodiments. For example, as shown in FIG. 5, when the image pickup portion 12 that is an optical functional portion is disposed at a corner of the IC 11, part of electrode pads may be disposed on the periphery of the IC 11. The remaining electrode pads may be disposed at center positions of the IC 11. Alternatively, as shown in FIG. 6, when a peripheral circuit portion that excludes the image pickup portion 12 of the IC 11 and the electrode pads 14 and 15 are protected with a black insulation film 61 having a low reflectance, light can be sufficiently suppressed from reflecting at the image pickup portion. In addition, the cover glass may not necessarily comprise glass if it has optical performance.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A photoelectric integrated circuit device, one optical functional portion for converting incident light into an electronic signal and a, comprising:

a body;

a photoelectric converting integrated element, disposed in a first area on the body, for converting an incident light into an electric signal;

a peripheral integrated circuit, disposed in a second area on the body, for processing the electric signal;

a first electrode pad, disposed on a periphery of the body, for being connected with an external element; and a second electrode pad, disposed in a third area on the body between the first area and the second area, for being connected with another external element;

wherein the first, second and third areas are not overlapped with each other, and the third area does not include the periphery.

2. The photoelectric integrated circuit device as set forth in claim 1, wherein the second electrode pad is a signal electrode pad connected electrically to the photoelectric converting integrated element.

3. The photoelectric integrated circuit device as set forth in claim 1, further comprising;

a wiring board having a land;

an optical member adhered with the wiring board; and a conductive conjunct which connects the second electrode pad with the land of the wiring board.

4. The photoelectric integrated circuit device as set forth in claim 1, wherein the first area occupies a center of the body.

5. The photoelectric integrated circuit device as set forth in claim 1, further comprising an insulation film having a low reflectance, wherein the body excluding the first area is protected with said insulation film.

6. The photoelectric integrated circuit device as set forth in claim 1, wherein the second electrode pad is a signal electrode pad connected electrically to the peripheral integrated circuit.

* * * * *